United States Patent
Kapre et al.

(10) Patent No.: US 9,842,629 B2
(45) Date of Patent: *Dec. 12, 2017

(54) MEMORY CELL ARRAY LATCHUP PREVENTION

(71) Applicant: Cypress Semiconductor Corporation, San Jose, CA (US)

(72) Inventors: Ravindra M Kapre, San Jose, CA (US); Shahin Sharifzadeh, Menlo Park, CA (US); Helmut Puchner, Santa Clara, CA (US); Nayan Patel, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/229,908

(22) Filed: Mar. 29, 2014

(65) Prior Publication Data

US 2014/0211547 A1 Jul. 31, 2014

Related U.S. Application Data

(63) Continuation-in-part of application No. 13/949,116, filed on Jul. 23, 2013, now Pat. No. 8,837,245, which
(Continued)

(51) Int. Cl.
*G11C 5/14* (2006.01)
*G11C 7/02* (2006.01)
(Continued)

(52) U.S. Cl.
CPC .................. *G11C 7/02* (2013.01); *G11C 5/14* (2013.01); *G11C 11/417* (2013.01);
(Continued)

(58) Field of Classification Search
USPC ................................. 365/226, 200
See application file for complete search history.

(56) References Cited

U.S. PATENT DOCUMENTS 4,040,120 A  8/1977 Geadah et al.
4,300,091 A  11/1981 Schade, Jr.
(Continued)

FOREIGN PATENT DOCUMENTS

JP  60225459 A  11/1985
JP  61285751 A  12/1986
(Continued)

OTHER PUBLICATIONS

U.S. Appl. No. 10/877,313 "Memory Cell Array Latchup Prevention," Ravindra M. Kapre et al., filed Jun. 25, 2004; 25 pages.
(Continued)

*Primary Examiner* — Anthan Tran

(57) ABSTRACT

A memory including current-limiting devices and methods of operating the same to prevent a spread of soft errors along rows in an array of memory cells in the memory are provided. In one embodiment, the method begins with providing a memory comprising an array of a plurality of memory cells arranged in rows and columns, wherein each of the columns is coupled to a supply voltage through one of a plurality of current-limiting devices, Next, each of the plurality of current-limiting devices are configured to limit current through each of the columns so that current through a memory cell in a row of the column due to a soft error rate event does not result in a lateral spread of soft errors to memory cells in the row in an adjacent column. Other embodiments are also provided.

17 Claims, 7 Drawing Sheets

Related U.S. Application Data is a continuation of application No. 13/280,937, filed on Oct. 25, 2011, now Pat. No. 8,493,804, which is a continuation of application No. 12/434,084, filed on May 1, 2009, now Pat. No. 8,045,410, which is a continuation of application No. 10/877,313, filed on Jun. 25, 2004, now Pat. No. 7,773,442.

(51) Int. Cl.
   *G11C 11/417*   (2006.01)
   *H01L 27/092*   (2006.01)
   *H02H 9/02*   (2006.01)
   *G11C 11/412*   (2006.01)

(52) U.S. Cl.
   CPC ...... *G11C 11/4125* (2013.01); *H01L 27/0921* (2013.01); *H02H 9/025* (2013.01)

(56) References Cited

U.S. PATENT DOCUMENTS

| | | | |
|---|---|---|---|
| 4,476,476 A | 10/1984 | Yu et al. | |
| 4,571,505 A | 2/1986 | Eaton, Jr. | |
| 4,631,421 A | 12/1986 | Inoue et al. | |
| 4,631,474 A | 12/1986 | Dolland | |
| 4,636,930 A | 1/1987 | Bingham et al. | |
| 4,672,241 A | 6/1987 | Venkatesh | |
| 4,672,584 A | 6/1987 | Tsuji et al. | |
| 4,797,724 A | 1/1989 | Boler et al. | |
| 4,837,639 A | 6/1989 | Masumoto | |
| 4,862,233 A | 8/1989 | Matsushita et al. | |
| 4,871,927 A | 10/1989 | Dallavalle | |
| 4,893,164 A | 1/1990 | Shirato | |
| 4,922,367 A * | 5/1990 | Hidaka | H01L 27/0921 257/E27.063 |
| 4,931,850 A | 6/1990 | Yamada | |
| 4,937,803 A | 6/1990 | Yao et al. | |
| 4,947,063 A | 8/1990 | O'Shaughnessy et al. | |
| 5,032,892 A | 7/1991 | Chern et al. | |
| 5,077,591 A | 12/1991 | Chen et al. | |
| 5,126,816 A | 6/1992 | Reczek et al. | |
| 5,140,177 A | 8/1992 | Suda et al. | |
| 5,338,986 A | 8/1994 | Kurimoto | |
| 5,347,185 A | 9/1994 | Tailliet | |
| 5,359,211 A | 10/1994 | Croft | |
| 5,406,513 A | 4/1995 | Canaris et al. | |
| 5,438,213 A | 8/1995 | Tailliet | |
| 5,440,244 A | 8/1995 | Richter et al. | |
| 5,452,171 A | 9/1995 | Metz et al. | |
| 5,455,436 A | 10/1995 | Cheng | |
| 5,483,213 A | 1/1996 | Mueller et al. | |
| 5,490,117 A | 2/1996 | Oda et al. | |
| 5,508,548 A | 4/1996 | Tailliet | |
| 5,561,312 A | 10/1996 | Nozoe et al. | |
| 5,576,637 A | 11/1996 | Akaogi et al. | |
| 5,610,426 A | 3/1997 | Asai et al. | |
| 5,663,310 A | 9/1997 | Shimoda et al. | |
| 5,686,752 A | 11/1997 | Ishimura et al. | |
| 5,721,445 A | 2/1998 | Singh et al. | |
| 5,736,777 A | 4/1998 | Shield et al. | |
| 5,747,834 A | 5/1998 | Chen et al. | |
| 5,753,955 A | 5/1998 | Fechner | |
| 5,821,572 A | 10/1998 | Walker et al. | |
| 5,894,153 A | 4/1999 | Walker et al. | |
| 5,903,424 A | 5/1999 | Tailliet | |
| 5,942,732 A | 8/1999 | Holmes | |
| 5,942,932 A | 8/1999 | Shen | |
| 5,962,902 A | 10/1999 | Kato et al. | |
| 5,982,600 A | 11/1999 | Cheng | |
| 6,031,405 A | 2/2000 | Yu | |
| 6,069,832 A | 5/2000 | Ma et al. | |
| 6,130,117 A | 10/2000 | Walker et al. | |
| 6,147,538 A | 11/2000 | Andresen et al. | |
| 6,157,070 A | 12/2000 | Lin et al. | |
| 6,207,542 B1 | 3/2001 | Ibok | |
| 6,275,089 B1 | 8/2001 | Song et al. | |
| 6,309,940 B1 | 10/2001 | Lee | |
| 6,373,105 B1 | 4/2002 | Lin | |
| 6,373,760 B1 * | 4/2002 | Ohbayashi | 365/200 |
| 6,392,472 B1 | 5/2002 | Kobayashi et al. | |
| 6,404,269 B1 | 6/2002 | Voldman | |
| 6,407,898 B1 | 6/2002 | Wu | |
| 6,465,283 B1 | 10/2002 | Chang et al. | |
| 6,483,337 B1 | 11/2002 | Blish et al. | |
| 6,492,863 B2 | 12/2002 | Kono et al. | |
| 6,497,956 B1 | 12/2002 | Phillips et al. | |
| 6,518,825 B2 | 2/2003 | Miyazaki et al. | |
| 6,671,153 B1 | 12/2003 | Ker et al. | |
| 6,690,056 B1 | 2/2004 | Reedy et al. | |
| 6,713,818 B2 | 3/2004 | Kodama | |
| 6,759,691 B2 | 7/2004 | Chen | |
| 6,768,616 B2 | 7/2004 | Mergens et al. | |
| 6,791,122 B2 | 9/2004 | Avery et al. | |
| 6,850,397 B2 | 2/2005 | Russ et al. | |
| 6,858,902 B1 | 2/2005 | Salling et al. | |
| 6,930,501 B2 | 8/2005 | Bargstaedt-Franke et al. | |
| 6,946,707 B2 | 9/2005 | Voldman | |
| 6,946,808 B2 | 9/2005 | Kandori | |
| 7,064,393 B2 | 6/2006 | Mergens et al. | |
| 7,067,884 B2 | 6/2006 | Okushima | |
| 7,071,528 B2 | 7/2006 | Ker et al. | |
| 7,110,230 B2 | 9/2006 | Van et al. | |
| 7,154,724 B2 | 12/2006 | Wu et al. | |
| 7,219,271 B2 * | 5/2007 | Kleveland et al. | 714/718 |
| 7,221,027 B2 | 5/2007 | Lin | |
| 7,253,999 B2 | 8/2007 | Ker et al. | |
| 7,274,047 B2 | 9/2007 | Russ et al. | |
| 7,288,450 B1 | 10/2007 | Tailliet | |
| 7,408,754 B1 | 8/2008 | O et al. | |
| 7,549,135 B2 | 6/2009 | Chapman et al. | |
| 7,773,442 B2 | 8/2010 | Kapre et al. | |
| 7,847,408 B2 | 12/2010 | Masleid et al. | |
| 8,044,457 B2 | 10/2011 | Salcedo et al. | |
| 8,045,410 B2 | 10/2011 | Kapre et al. | |
| 8,493,804 B2 | 7/2013 | Kapre et al. | |
| 8,638,135 B2 | 1/2014 | Camarena et al. | |
| 8,685,800 B2 | 4/2014 | Yang et al. | |
| 8,837,245 B2 * | 9/2014 | Kapre et al. | 365/206 |
| 2002/0142500 A1 | 10/2002 | Foglietti et al. | |
| 2009/0213677 A1 | 8/2009 | Kapre et al. | |
| 2012/0008243 A1 | 1/2012 | Huitsing et al. | |

FOREIGN PATENT DOCUMENTS

| | | |
|---|---|---|
| JP | 62211945 A | 9/1987 |
| JP | 63169061 | 7/1988 |
| JP | 64025456 | 1/1989 |
| JP | 2000058677 A | 2/2000 |

OTHER PUBLICATIONS

U.S. Appl. No. 12/434,084 "Memory Cell Array," Ravindra M. Kapre et al., filed May 1, 2009; 29 pages.

U.S. Appl. No. 13/280,937: "Memory Cell Array Latchup Prevention," Ravindra M. Kapre, filed Oct. 25, 2011; 25 pages.

Application No. PCT/US05/20800 "Memory Cell Array Latchup Prevention," Filed on Jun. 13, 2005; 14 pages.

International Search Report of the International Searching Authority for International Application No. PCT/US2005/020800 dated Dec. 23, 2005; 4 pages.

Office Action Receive for Application No. 2007-518108 dated Aug. 31, 2011; 2 pages.

Pavan et al., "Latch-up DC triggering and holding characteristics on n-well, twin-tub and epitaxial CMOS technologies," IEE Proceedings-G, vol. 138, No. 5, Oct. 1991, pp. 604-612; 9 pages.

Sangiorgi et al., "Latch-up in CMOS Circuits: a Review," European Transactions on Telecommunications and Related Technologies, vol. 1, No. 3, May/Jun. 1990, pp. 337-349; 13 pages.

USPTO Final Rejection for U.S. Appl. No. 10/877,313 dated Jun. 12, 2008; 6 pages.

USPTO Miscellaneous Action for U.S. Appl. No. 10/877,313 dated Jan. 22, 2009; 2 pages.

(56) References Cited

OTHER PUBLICATIONS

USPTO Miscellaneous Action for U.S. Appl. No. 10/877,313 dated Jul. 19, 2005; 1 page.
USPTO Non-Final Rejection for U.S. Appl. No. 10/877,313 dated Apr. 26, 2006; 8 pages.
USPTO Non-Final Rejection for U.S. Appl. No. 10/877,313 dated May 9, 2007; 6 pages.
USPTO Non-Final Rejection for U.S. Appl. No. 10/877,313 dated Dec. 27, 2007; 10 pages.
USPTO Non-Final Rejection for U.S. Appl. No. 10/877,313 dated Sep. 29, 2006; 5 pages.
USPTO Non-Final Rejection for U.S. Appl. No. 10/877,313 dated May 29, 2009; 9 pages.
USPTO Non-Final Rejection for U.S. Appl. No. 12/434,084 dated Jan. 13, 2011; 4 pages.
USPTO Non-Final Rejection for U.S. Appl. No. 13/949,116 dated Apr. 11, 2014; 6 pages.
USPTO Notice of Allowance for U.S. Appl. No. 10/877,313 dated Feb. 23, 2010; 6 pages.
USPTO Notice of Allowance for U.S. Appl. No. 10/877,313 dated Mar. 26, 2007; 6 pages.
USPTO Notice of Allowance for U.S. Appl. No. 10/877,313 dated Jul. 6, 2010; 4 pages.
USPTO Notice of Allowance for U.S. Appl. No. 10/877,313 dated Nov. 4, 2009; 6 pages.
USPTO Notice of Allowance for U.S. Appl. No. 12/434,084 dated Jun. 23, 2011; 7 pages.
USPTO Notice of Allowance for U.S. Appl. No. 13/280,937 dated Jun. 11, 2013; 8 pages.
USPTO Notice of Allowance for U.S. Appl. No. 13/280,937 dated Oct. 2, 2012; 7 pages.
USPTO Requirement for Restriction/Election for U.S. Appl. No. 10/877,313 dated Mar. 13, 2006; 5 pages.
USPTO Requirement Restriction for U.S. Appl. No. 12/134,084 dated Oct. 27, 2010; 6 pages.
Written Opinion of the International Searching Authority for International Application No. PCT/US05/20800 mailed Dec. 25, 2006; 6 pages.
KIPO/Korean Office Action for Application No. 10-2007-7001931 dated Feb. 26, 2012; 3 pages.
Office Action for Japan Patent Application No. 2007-518108 dated May 31, 2011; 2 pages.
USPTO Notice of Allowance for U.S. Appl. No. 13/949,116 dated Jun. 12, 2014; 8 pages.
KIPO/Korean Office Action for Application No. 10-2007-7001931 dated Jan. 17, 2012; 6 pages.
The Patent Office of the State Intellectual Property Office of the People's Republic of China—The First Office Action for Chinese Application No. 200580020516.1 dated Jul. 4, 2008; 13 pages.

\* cited by examiner

MEMORY CELL ARRAY LATCHUP PREVENTION

CROSS-REFERENCE TO RELATED APPLICATIONS

This application is a continuation-in-part-application of U.S. application Ser. No. 13/949,116, filed on Jul. 23, 2013, which is a continuation of U.S. application Ser. No. 13/280,937, filed on Oct. 25, 2011, now U.S. Pat. No. 8,493,804, which is a continuation of U.S. application Ser. No. 12/434,084 filed on May 1, 2009 now U.S. Pat. No. 8,045,410, which is a continuation application of U.S. application Ser. No. 10/877,313 filed on Jun. 25, 2004 now U.S. Pat. No. 7,773,442, all of which are incorporated herein by reference.

TECHNICAL FIELD

This invention relates to integrated circuits and, more specifically, complementary metal oxide semiconductor (CMOS) memory circuits that are configured to be free or immune from latch up.

BACKGROUND

The following descriptions and examples are given as background information only.

Integrated circuit semiconductor devices using CMOS technology inherently contain parasitic bipolar pnp and npn transistors in the structure of p-channel metal oxide semiconductor (PMOS) and n-channel metal oxide semiconductor (NMOS) devices. For example, in a structure of a n-well CMOS circuit, a parasitic pnp bipolar transistor may be formed when a source/drain region of a PMOS device acts as an emitter, the n-well of the PMOS device acts as a base, and a p-type doped substrate acts as the collector. In addition, a parasitic npn bipolar transistor may be formed when a source/drain region of the NMOS device acts as an emitter, a substrate tie of the NMOS device acts as a base, and the n-well of the PMOS device acts as the collector. Since the parasitic bipolar transistors are connected through the n-well of the PMOS device (serving as the collector of the npn bipolar transistor and the base of the pnp bipolar transistor) and through p-type doped substrate (serving as the collector of the pnp bipolar transistor and the base of the npn bipolar transistor), the transistors interact electrically to form a pnpn diode structure equating to a silicon controlled rectifier (SCR).

A disadvantage of forming an SCR within a CMOS circuit is that it allows a low-resistance path between power supply buses to form, which in turn allows high amounts of current to flow through the circuit. In some cases, the current through the circuit can be amplified to a level at which one or more memory cells are in a state where they cannot be switched. In particular, internal voltages across the anode and cathode of an SCR which exceed a breakover or trigger voltage can cause junctions within the bipolar transistors of the circuit to become forward-biased. As a result, the SCR enters into a low impedance state with the possibility of a resultant high current. The low impedance state can be maintained indefinitely if a minimum holding current can be supplied to the circuit. As a consequence, the memory cells of the circuit may be restricted from switching and may lose their data. The SCR, in such a state, is commonly referred to as being latched up and, thus, the phenomenon of inducing a circuit into such a state is commonly referred to as "latch up."

As device dimensions continue to decrease and device density increases, the latch up phenomenon becomes more prevalent. In particular, the closer NMOS and PMOS devices are fabricated relative to each other, the breakover voltage needed to forward-bias junctions within pnpn diode structures created therefrom as well as the minimum holding current needed to maintain a circuit in such a state decrease. As such, various techniques for controlling latch up in CMOS circuits have been proposed and are used in the microelectronics fabrication industry. For example, one method for controlling latch up in CMOS circuits involves incorporating well and/or substrate taps within a circuit to respectively reduce well and substrate resistances. In order to realize the benefit of such a technique, the taps are generally fabricated within each cell of a memory array. As a consequence, cell size is undesirably increased and the objective to increase memory cell density is hindered. In addition, the fabrication of contacts is sensitive to processing parameters of the circuit, such as mask alignment, for example.

Another technique used in the microelectronics industry for controlling latch up in CMOS circuits includes the formation of low resistance well regions having a varied doping profile within the substrate of the circuit. Such a technique is used to reduce the current-gain product of the parasitic bipolar transistors of the CMOS circuit and retard minority carrier injection into active junctions of the device. The formation of low resistance well regions, however, induces higher junction capacitance, which may undesirably increase the threshold voltage at which devices operate. Higher threshold voltages lead to decreased circuit speeds, which is contrary to the industry objective to increase processing speeds within circuits. Moreover, the formation of low resistance well regions does not completely eliminate the formation of latch up. In addition, well region fabrication is sensitive to processing parameters of the circuit, such as mask alignment and processing temperatures, for example. In particular, the placement of well regions within a circuit is directly dependent on the correct alignment of masks with the substrate. Misplacement of well regions may adversely affect the functionality of the device and, in some cases, cause the device to malfunction. In addition, the diffusion of dopants both vertically and horizontally can vary with the temperature, affecting the efficacy of low resistance wells. Furthermore, the activation of dopants to form well regions involves a thermal process, which is an additional restraint for the overall thermal budget of the device.

It would, therefore, be advantageous to develop other manners in which to prevent latch up in CMOS circuits. In particular, it would be beneficial to develop techniques for preventing latch up which do not increase memory cell size, are less sensitive to process variations and do not affect the functionality of the CMOS circuits.

BRIEF DESCRIPTION OF THE DRAWINGS

Embodiments of the present invention are illustrated by way of example, and not limitation, in the figures of the accompanying drawings in which.

Figure 1A:
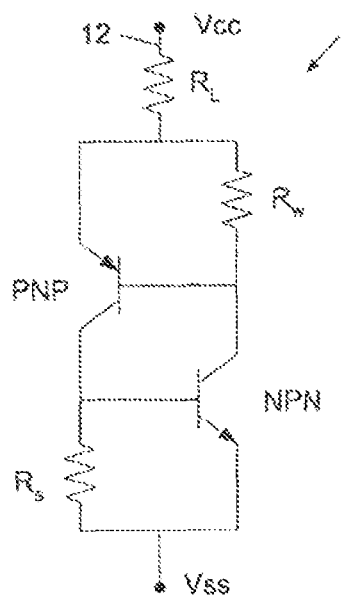
FIG. 1a depicts an exemplary circuit diagram of a portion of a CMOS circuit having a resistor formed along a power-supply bus of the circuit.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 1B:
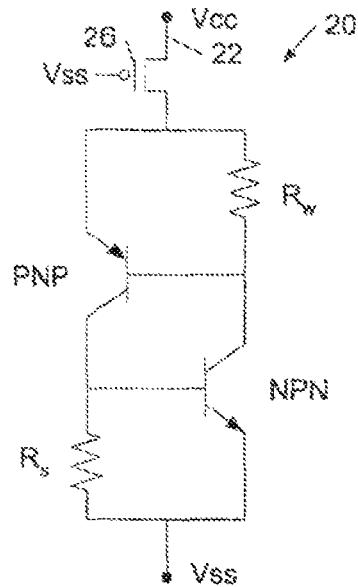
FIG. 1b depicts an exemplary circuit diagram of a portion of a CMOS circuit having a p-channel resistor pass gate formed along a power-supply bus of the circuit.
Figure 2:
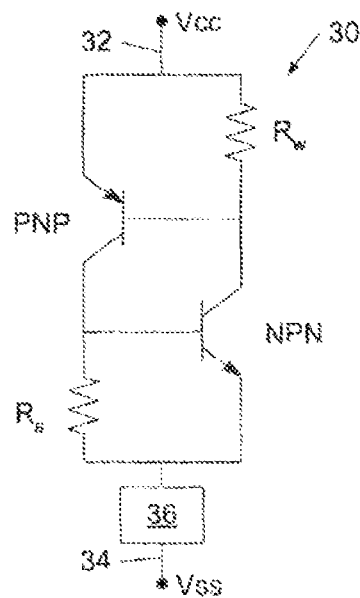
FIG. 2 depicts an exemplary circuit diagram of a portion of a CMOS circuit having one or more current-limiting devices formed along a ground bus of the circuit.

Turning to the drawings, exemplary embodiments of CMOS circuits having current limiting devices arranged along power-supply buses and/or ground buses are illustrated. In particular, FIG. 1a illustrates resistor $R_L$ formed along power-supply bus 12 of CMOS circuit 10. FIG. 1b illustrates p-channel pass gate transistor 26 formed along power-supply bus 22 of CMOS circuit 20. CMOS circuit 30 is shown in FIG. 2 having current-limiting device 36 along ground bus 34 and CMOS circuit 40 shown in FIG. 3 includes current-limiting devices 46 and 48 arranged along power-supply bus 42 and ground bus 44, respectively. Each of the circuits is described in more detail below, particularly in reference to the arrangement and type of current-limiting devices included therein. In addition to the current-limiting devices, the CMOS circuits depicted in FIGS. 1a-3 include parasitic resistances Rw and Rs, respectively referring to parasitic resistances of the well regions and substrate used to form complementary sets of PMOS and NMOS transistors within the circuits.

As shown in FIGS. 1a-3, the CMOS circuits include parasitic bipolar transistors PNP and NPN. The parasitic bipolar transistors are the result of multiple diffusions used to fabricate complementary sets of PMOS transistors and NMOS transistors within the circuits. As noted above, a parasitic PNP bipolar transistor may be formed within an n-well CMOS circuit when a source/drain region of a p-channel transistor acts as an emitter, the n-well of the PMOS transistor acts as a base, and a p-type doped substrate acts as the collector. In addition, a parasitic NPN bipolar transistor may be formed within an n-well CMOS circuit when a source/drain region of the n-channel transistor acts as an emitter, a substrate tie of the n-channel transistor acts as abuse, and the n-well of the p-channel transistor acts as the collector. The n-type and p-type regions of parasitic bipolar transistors differ slightly for a p-well CMOS circuit in that the p-well acts as a collector of the PNP transistor and the base of the NPN transistor. The n-doped substrate in such a circuit acts as a collector for the NPN transistor and a base for the PNP transistor. As in the n-well CMOS circuit, the source and drain regions of each of the PMOS and NMOS devices respectively serve as the emitters for the PNP and NPN transistors.

Although not shown, the circuit of the PNP and NPN bipolar transistor and resistances Rw and Rs is one of a plurality of devices within CMOS circuits 10, 20, 30 and 40 representing a memory cell array between high voltage source Vcc and low voltage source Vss. Consequently, the current-limiting devices included within circuits 10, 20, 30 and 40 may be used to restrict current through entire memory arrays, rather than just the circuit PNP and NPN bipolar transistor and resistances Rw and Rs shown in FIGS. 1a-3. In other embodiments, however, the current-limiting devices may be arranged to restrict current through only a subset of memory cells within an array, such as a column or a row of an array or a block of memory cells residing within a plurality of columns and rows.

Figure 4:
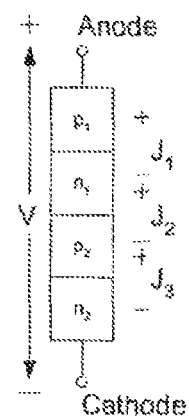
FIG. 4 depicts an exemplary structure of a pnpn diode structure.
Figure 5:
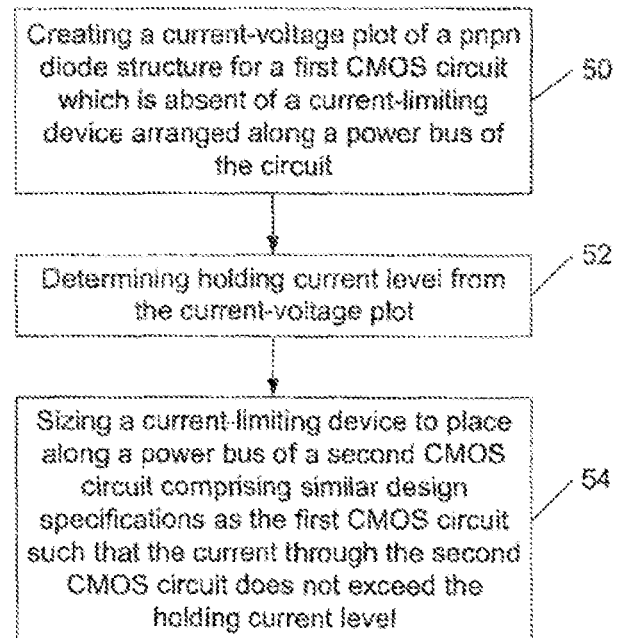
FIG. 5 depicts a flow chart of a method for sizing a current-limiting device within a CMOS circuit to prevent latch up within the circuit.
Figure 6A:
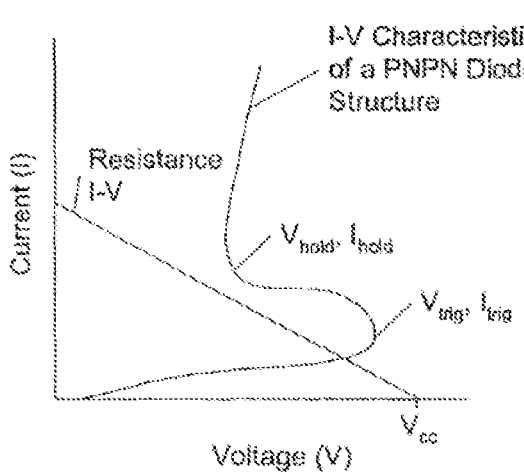
FIG. 6a depicts a graph including I-V plots of a pnpn diode structure and a resistor.
Figure 6B:
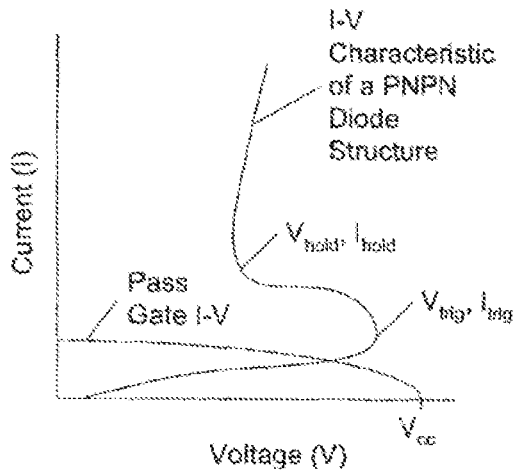
FIG. 6b depicts a graph including I-V plots of a pnpn diode structure and a pass gate transistor.

A pnpn diode structure formed from merged regions of parasitic bipolar transistors is illustrated in FIG. 4. Such a structure may be formed within each of CMOS circuits 10, 20, 30 and 40, since the base and collector regions of the PNP and NPN bipolar transistors are connected. The share regions are referenced in FIG. 4 as $n_1$ and $p_2$. In an effort to further explain the phenomenon of latch up, the pnpn diode structure illustrated in FIG. 4 is discussed in conjunction with FIGS. 6a and 6b, which illustrate exemplary current-voltage (I-V) plots of pnpn diode structures. The distinction between FIGS. 6a and 6b is the inclusion of I-V characteristics for a resistor and a p-channel pass gate transistor, respectively. The use of such I-V characteristics with the I-V plot of a pnpn diode structure is explained in more detail below in reference to FIG. 5. A description of the I-V characteristic of a pnpn diode structure without a description of I-V characteristics for a resistor and a p-channel pass gate transistor, however, is discussed in combination with FIG. 4 to explain its relation to latch up within a CMOS circuit.

As shown in FIG. 4, the pnpn diode structure is interposed between an anode and cathode, which are referenced as voltage sources Vcc and Vss in FIGS. 1a-3. In addition, three junctions, $J_1$, $J_2$, and $J_3$, are formed in the pnpn diode structure shown in FIG. 4. When there is very little current flow through the pnpn diode structure, the device is referenced as being in an "off," "forward-blocking," or "high-impedance" state. In such a state, $J_1$ and $J_3$ junctions are weakly forward-biased and junction $J_2$ is weakly reversed-biased. The I-V characteristic in such a state is represented in the first portion of the pnpn diode I-V plot shown in FIGS. 6a and 6b. In particular, the portion of the plot showing current steadily increasing from zero current with increasing voltage represents the "off" state of the device.

The reference of "weakly" biased junctions may generally refer to junctions having a bias which is less than the built-in voltage or potential of the junction. The reference of a "strong" biased junction, however, may conversely refer to a junction which is greater than the built-in voltage or potential of the junction. For example, in some applications, weakly forward biased junctions may refer to junctions which are biased at voltages less than approximately 0.7 V and strongly forward biased junctions may refer to junctions which are biased at voltages greater than approximately 0.7 V. The voltage level for distinguishing weak and strong forward biased junctions, however, may be smaller or larger, depending on the design specifications of the devices comprising the junction. In addition, the voltage level distinguishing weak and strong reversed biased junctions may be different than those for forward bias junctions. In some cases, a strongly biased junction may be strong enough to influence the biasing of an adjacent weakly biased junction, such as in a case when two end junctions of a pnpn diode structure are forward biased enough to forward bias a middle junction of the diode structure as described in more detail below.

As shown in FIGS. 6a and 6b, the voltage starts to decrease when the portion of the I-V characteristic reaches a point referred to as the triggering point. The triggering point is denoted in FIGS. 6a and 6b as $V_{trig}$ and $I_{trig}$, referring to voltage and current triggering points, respectively. At such a point, junctions J1 and J3 are strongly forward biased due to a regenerative bipolar action wherein part of the npn collector current becomes the pnp base current which is further amplified by the pnp bipolar transistor resulting in a higher pnp collector current. A part of the higher pnp collector current becomes the npn base current which in turn is amplified by the npn bipolar transistor resulting in a higher npn collector current. The iterative increase in pnp and npn collector current inherently increases the forward biasing of the junctions.

After the triggering point, the device exhibits a differential negative resistance (i.e., the voltage sharply decreases as the current slightly increases). During such a portion of the I-V characteristic, the device switches from an "off" state to an "on" state, which is also referred to as a "low-impedance" or "forward conducting" state. In addition, junction J2 is changed from reverse-biased to forward-biased since region p2 in FIG. 4 has a higher potential than region n1. Once the pnpn diode structure is fully transitioned to the "on" state, the current sharply increases and the voltage slightly increases. The point in the I-V plot at which such a change occurs is referenced as the holding level and is denoted in FIGS. 6a and 6b as $I_{hold}$ and $V_{hold}$, referring to the current and voltage levels, respectively. If the circuit is able to supply current above the holding level, the device will remain latched in such a state even if the source of the trigger current is removed. Latch up within a CMOS circuit can be caused by a variety of mechanisms, including but not limited to terminal overvoltage stress, transient displacement currents, and ionizing radiation, such as neutron or alpha radiation. The circuits described herein are configured to reduce or eliminate such causes of latch up. In particular, the circuits described herein include a current-limiting device along at least one of the power-supply bus and ground bus of the circuit such that a junction of the pnpn diode structure therein may be maintained as reverse-biased.

Returning to FIGS. 1a-3, exemplary embodiments of CMOS circuits with current-limiting devices arranged along the power-supply bus or ground bus of the circuits are illustrated. In particular, FIGS. 1a and 1b illustrate embodiments in which a current-limiting device is arranged along a power-supply bus of a CMOS circuit. FIG. 1a illustrates resistor $R_L$ formed along power-supply bus 12 of CMOS circuit 10 and FIG. 1b illustrates p-channel pass gate transistor 26 formed along power-supply bus 22 of CMOS circuit 20. A "pass gate transistor," as used herein, may generally refer to a transistor having one or both of its source and drain terminals not directly coupled to a power supply of the circuit. Alternatively stated, a pass gate transistor may refer to a transistor having only one or none of its source and drain terminals directly coupled to a power supply of the circuit. In this manner, a pass gate transistor may generally refer to a transistor having at least one of its source and drain terminals that never reaches the potential of the power supply to which it is indirectly coupled. For example, p-channel pass gate transistor 26 in circuit 20 has one node tied directly to voltage source Vcc and another node not directly tied to voltage source Vss. Alternatively, an n-channel pass gate transistor arranged along a ground bus of a circuit, as described in reference to FIGS. 2 and 3 below, may be have a node tied directly to voltage source Vss and another node not directly tied to voltage source Vcc. In yet other cases, the p-channel and n-channel pass gate transistors of the circuits described herein may not have either of their source and drain nodes directly coupled to voltage sources Vcc or Vss.

The resistor and p-channel pass gate transistor included in circuits 10 and 20, respectively, may serve to bleed current from power-supply buses 12 and 22 such that the amount of current drawn through the respective circuits is reduced to a level below a holding current level of a pnpn diode structure in the circuits. In some embodiments, the circuits described herein may include more than on current-limiting device on a power-supply bus and/or a ground bus of the circuit. As such, in some embodiments, CMOS circuit 10 may include multiple resistors arranged along power-supply bus 12. In addition, CMOS circuit 20 may include multiple p-channel pass gate transistors arranged along power-supply bus 22 in some cases. In yet other embodiments, CMOS circuits 10 and/or 20 may include a combination of p-channel pass gate transistors and resistors arranged along their power-supply buses.

Figure 3:
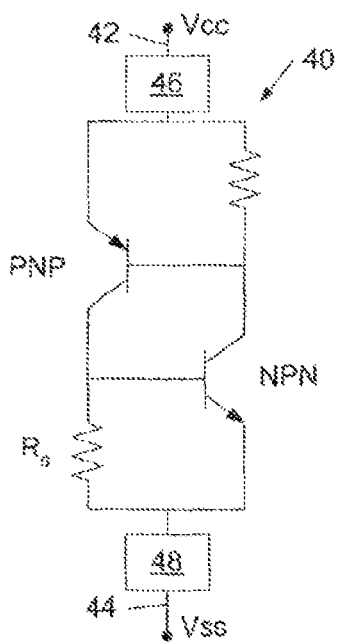
FIG. 3 depicts an exemplary circuit diagram of a portion of a CMOS circuit having one or more current-limiting devices formed along both a power-supply bus and a ground bus of the circuit.

FIGS. 2 and 3 illustrate alternative embodiments in which CMOS circuits include current-limiting devices along ground buses of the circuits. In particular, FIG. 2 illustrates CMOS circuit 30 having current-limiting device 36 arranged along ground bus 34. In such an embodiment, power-supply 32 of CMOS circuit 30 may be absent of a current limiting device. In other embodiments, however, the circuit described herein may include current-limiting devices along both the power-supply and ground buses of the circuit. For example, FIG. 3 illustrates CMOS circuit 40 including current-limiting devices 46 and 48 arranged along power-supply bus 42 and ground bus 44, respectively. Current-limiting devices 36, 46, and 48 in FIGS. 2 and 3 are shown as blocks to indicate that any type, number, or combination of current-limiting devices may be arranged on the buses of the circuits. In particular, current-limiting devices 36 and 48 in FIGS. 2 and 3 may include one or more resistors and/or one or more n-channel pass gate transistors, and current limiting device 46 may include one or more resistors and/or one or more p-channel pass gate transistors.

In general, the CMOS circuits described in reference to FIGS. 1a-3 may have current-limiting devices arranged along any portion of their power-supply buses and/or ground buses. For example, one or more current-limiting devices may be arranged along a portion of a power-supply bus which is configured to supply power to all devices within the circuit. More specifically, one or more current-limiting devices may be arranged along a portion of a power-supply bus close to high voltage source Vcc which is configured to supply power to all memory cells within a memory array of the circuit. In other embodiments, one or more current-limiting devices may be additionally or alternatively arranged along a portion of the power-supply bus which supplies current to a subset of memory cells within a circuit. For example, one or more of the current-limiting devices may be arranged along a portion of the power supply bus which supplies current to a single column or row of a memory array of CMOS transistors. In addition or to alternatively, one or more current-limiting devices may be arranged along portions of the power-supply bus configured to supply current to a block of memory cells residing in a plurality of columns and rows. The portions of the power-supply bus supplying power to subsets of memory cells may be portions partitioned from the portion of the power-supply bus near high voltage source Vcc supplying current to all devices within the circuit.

One advantage of arranging a current-limiting device along a portion of the power supply bus which supplies current to one or two columns and/or rows of a memory array is that the reliability degradation of redundancy repaired memory arrays is reduced. Redundancy within a memory array involves the creation of spare rows and columns which can be used as substitutes for production rows and columns, which are found to be defective. Additional circuitry is also provided within a memory array to control the physical encoding that enables the substitution of a spare column or row for a defective column or row. The concept of row redundancy repair involves replacing bad bit lines or word lines with good bit line or word lines, respectively. The column or row to be repaired is not physically replaced, but rather it is logically replaced. In particular, whenever a column or row address is called, the address is compared to the addresses of known bad column or rows. If the address comparison produces a match, then a replacement bit line or word line is fired in place of the defect bit line or word line.

As noted above, methods for preventing latch up in conventional memory array circuits is to incorporate well regions or contacts within each memory cell of the memory array. Since the fabrication of well regions and contacts are process sensitive, the likelihood of latch up within an array varies between memory cells. As a result, a reliability risk exists when repairing memory arrays through redundancy. The circuits described herein preferably eliminate the likelihood of latch up within memory cells or at least reduce the likelihood of latch up to be substantially similar throughout an array. As a result, reliability degradation of redundancy repaired memory cells will be reduced. Embodiments having a current-limiting device for every one or two columns or rows of the array, including the spare columns and rows, may particularly reduce reliability degradation of redundancy repaired memory cells.

Ground bus lines are often configured in a grid pattern in order to serve as the negative power source with which to induce current through a plurality of devices within a circuit. Consequently, one or more current-limiting devices may be arranged along any portion of a ground bus and have substantially the same impact on preventing latch up within the circuit than if the current-limiting devices were arranged along another portion of the ground bus. In embodiments in which a ground line is not arranged in a grid pattern, however, the arrangement of current-limiting devices along the ground line may be specific to restricting current through a subset of devices within the circuit in some cases. In any case, one or more current-limiting devices may be additionally or alternatively arranged along a portion of the ground line close to low voltage source Vss such that current is restricted through all devices within the circuit.

As noted above, the circuits described herein may include one or more current-limiting devices. In particular, the circuits may include one or more current limiting devices arranged along the same portion of a power-supply bus or ground bus. In other embodiments, the circuit may include one or more current limiting devices arranged along a plurality of different portions of a power-supply bus and/or ground bus. In addition, in embodiments in which a plurality of current-limiting devices are arranged along a power-supply bus and/or ground bus of a circuit, the current-limiting devices included may be similarly or differently sized. In particular, the current-limiting devices may be configured to restrict similar amounts of current or different amounts of current. In some cases, the number, size and placement of current-limiting devices may be optimized for different portions of a circuit.

As noted above, in addition to showing I-V characteristics of a pnpn diode structure, FIGS. 6a and 6b illustrate I-V characteristics of a resistor and a pass gate transistor, respectively. Such lines may be used to size a current-limiting device such that latch up may be prevented in a circuit. Alternatively stated, correlating I-V characteristics of a pnpn diode structure and a resistor and/or pass gate transistor may allow a circuit to be designed with a current-limiting device sufficient to maintain a junction of the pnpn diode structure as reversed-biased. In this manner, a current-limiting device may be referred to as being "configured" to prevent latch up within a memory cell. A flowchart of a method outlining such a design process is illustrated in FIG. 5 and is discussed in conjunction with FIGS. 6a and 6b. As shown in FIG. 5, the method may include block 50 in which an I-V plot of a pnpn diode structure arranged within a CMOS circuit which is absent of a current-limiting device arranged along a power bus of the circuit is created. Although I-V plots of pnpn diode structures may vary slightly depending on the design characteristics of the device in which they are arranged, the basic shape and points of interests, such as the triggering point and holding points, remain substantially the same. As such, the I-V characteristics of a pnpn diode structure discussed above relative to FIGS. 6a and 6b may correlate to the I-V plot referenced in block 50. The formation of the I-V plot referenced in block 50 may preferably be obtained by a simulation program, but may alternatively be obtained by manual means.

As shown in FIG. 5, the method may continue to block 52 to determine a holding current level of the pnpn diode structure from the I-V plot created in block 50. As noted above, the holding current level may refer to the level of current which is sufficient to keep a circuit latched even after a triggering current is removed. Such a level is referred to as $I_{hold}$ in FIGS. 6a and 6b. The method continues in FIG. 5 to block 54 in which a current-limiting device to be placed along a power bus of a second CMOS circuit having similar design specifications as the CMOS circuit used to create the I-V plot referenced in block 50 is sized such that the current through the second CMOS circuit does not exceed the holding current level of a pnpn diode structure within the circuit. Such a step may include selecting a current-limiting device having an I-V characteristic which intersects the I-V plot of the pnpn diode structure at a level below the holding current level. The selection may be conducted by plotting the I-V characteristic of an exemplary current-limiting device to determine if the line intersects the current-voltage plot of the pnpn diode structure at a level below the holding current level. Such plotting may be conducted using a simulation program or may be done manually. In embodiments in which multiple current-limiting devices are arranged along power bus of a CMOS device, an I-V characteristic which is representative of the combination of current-limiting devices may be plotted along with the I-V characteristic of the pnpn diode structure. In this manner, the current-limiting devices may be sized such that an I-V characteristic of a combination of the devices intersect the current-voltage plot of the pnpn diode structure at a level below the holding current level.

In some cases, the method may include sizing the current-limiting device to be placed along the power bus of the second CMOS circuit such that the current through the second CMOS circuit does not exceed the trigger current level of the I-V plot of the pnpn diode structure. Such a step may include selecting a current-limiting device having an I-V characteristic which intersects the I-V plot of the pnpn diode structure at a level below the trigger current level as shown in FIGS. 6a and 6b. As with selecting a current-limiting device having an I-V characteristic which intersects the I-V plot of the pnpn diode structure at a level below the holding current level, the selection of a current-limiting having an I-V characteristic which intersects the I-V plot of the pnpn diode structure at a level below the trigger current level may include sizing a single current-limiting device or multiple current-limiting devices.

In another aspect, it has been found that the current-limiting device of the present disclosure is particularly useful to substantially prevent the spread of soft errors along rows, parallel to the word lines, in a memory cell array.

Soft errors are random errors that can appear in a memory device that are not related to any defect in the memory device but rather are attributed, either directly or indirectly, to high energy radiation such as high energy or cosmic ray neutrons, alpha particles, gamma particles, and heavy ion bombardment. More particularly, soft errors are believed to result from these high energy particles traveling through a semiconductor substrate and generating electron hole pairs. The generated electron-hole pairs can cause a change in state of the data stored within a memory device. For example, the generated electron hole pairs may result in loss of charge from a storage capacitor in a memory cell. In the case of a latch-based static RAM (SRAM) type cell, the cell may "flip", resulting in the opposite logic value being stored. Soft errors in semiconductor devices are often described in terms of a soft-error rate (SER). An SER can be an indication of an integrated circuit's degree of susceptibility to soft-error events.

Figure 7:
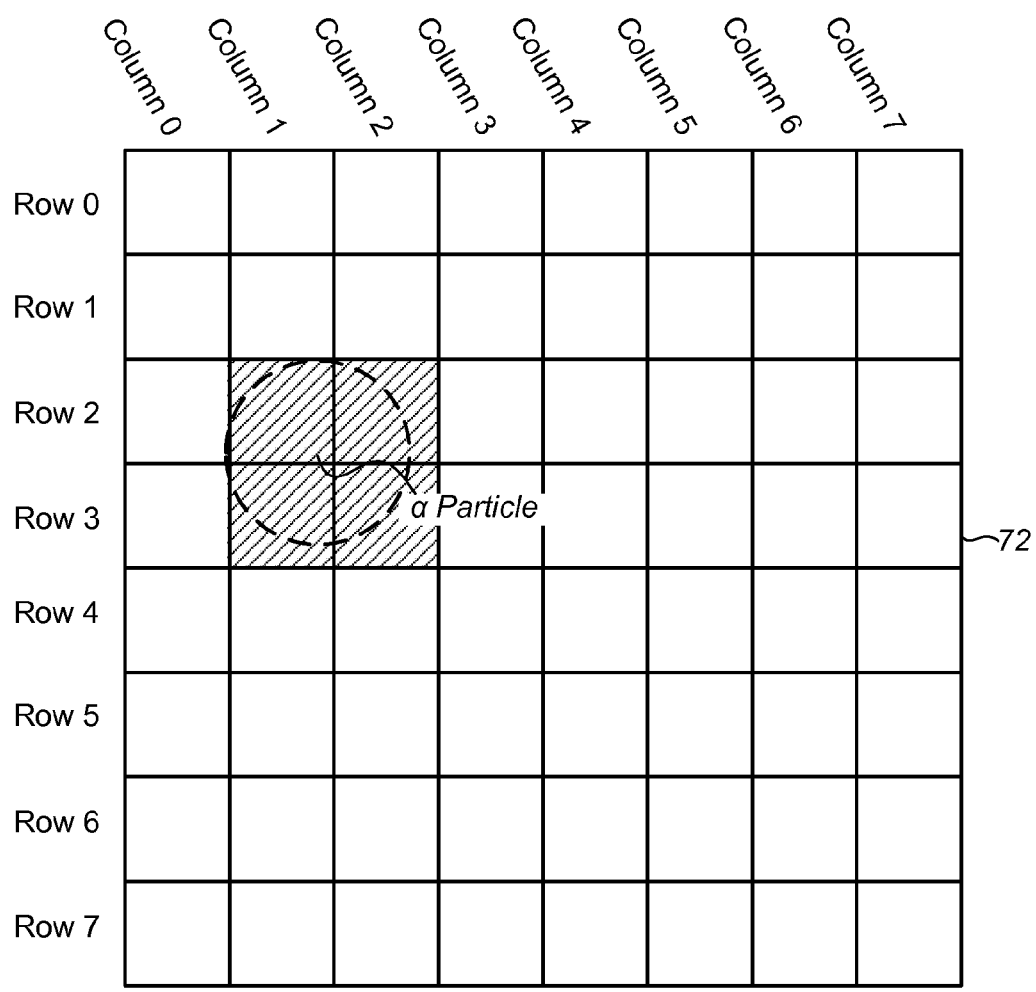
FIG. 7 depicts a block diagram illustrating a portion of an array of memory cells in a memory device arranged in rows and columns, and illustrating the impact of an alpha particle on the memory cells.

FIG. 7 is a block diagram illustrating a portion of an array 72 of memory cells in a memory device arranged in rows and columns. Referring to FIG. 7 it is noted that a single SER event, for example an alpha particle (a) interacting with a memory cell in the array, can generate a number of electron-hole pairs, possibly resulting in multi-bit errors in physically adjacent memory cells, as indicated by shading in adjacent memory cells in columns 1 to 2 and rows 2 to 3. Moreover, because memory cells in adjacent columns are coupled through shared positive supply voltage ($V_{DD}$) and/or a negative supply voltage ($V_{SS}$), excessive current through a memory cell in one column due to a soft error can cause the supply voltage in adjacent columns to collapse resulting in the spread of soft errors along the row. Thus, a single bit soft error becomes a multi-bit soft error in a single word.

Because of this, prior technologies to reducing the SER in SRAM devices have relied on use of widely spaced interleaving schemes and/or complex, multi-bit error checking codes to prevent multi-bit errors in physically adjacent memory cells from becoming logical multi-bit errors. However, this approach has a number of disadvantages that may include increased current consumption and/or larger memory cell sizes due to the need for multiple error checking bits for each word, and/or widely spaced interleaving schemes, such as 16 bit interleaving in which bits of a single word in a row are separated by 16 columns, or even 32 bit interleaving.

Figure 8A:
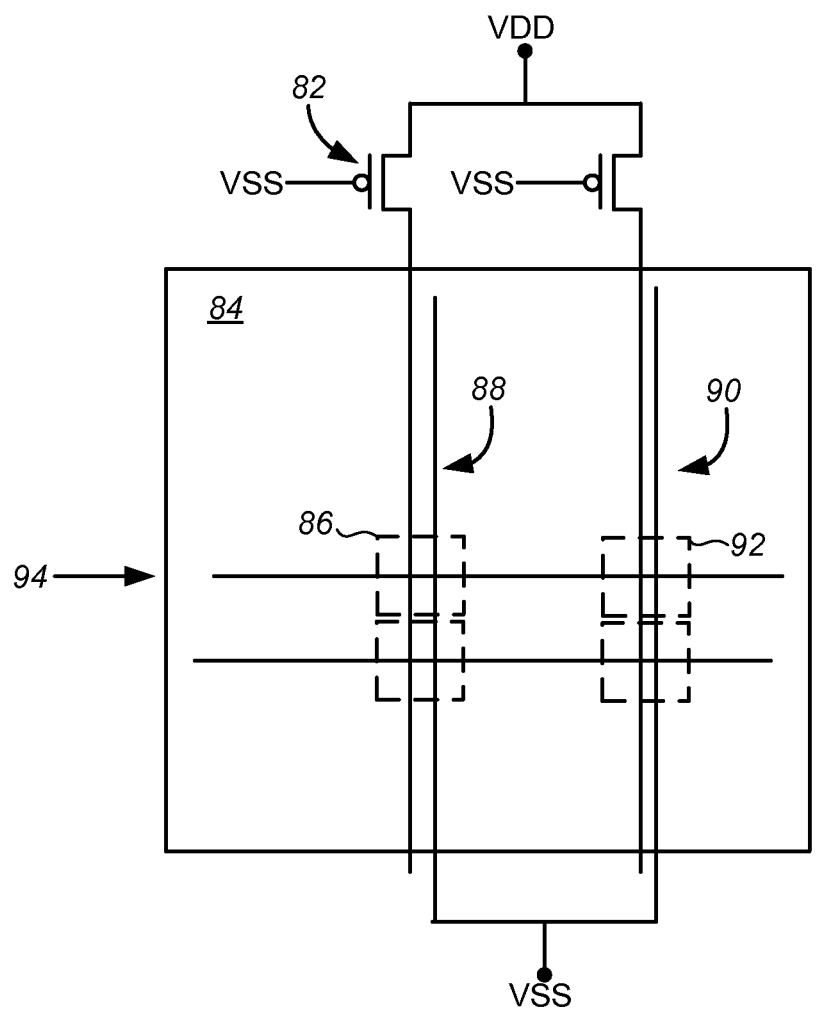
FIGS. 8A and 8B depict exemplary circuit diagrams of a portion of a memory having one or more current-limiting devices configured to prevent a spread of soft errors along rows in the array.

In contrast to the prior technologies the current-limiting device of the present disclosure can substantially prevent the spread of soft errors along rows in a memory cell array, without the need for widely spaced interleaving complex, multi-bit error checking schemes. Referring to FIG. 8A, in one embodiment a PMOS current limiting device 82, such as a p-type field-effect-transistor (PFET), is placed in $V_{DD}$ path of each column within a memory array 84 with a gate of the current limiting device coupled to $V_{SS}$. When an alpha particle (a) produces a soft error in a memory cell 86 in a first column 88, the current limiting device 82 prevents latch up from occurring by limiting the current in the column. Since an adjacent column 90 is separately powered or isolated from the first column 88 by the current limiting device 82, the columns do not interact with one another via the $V_{DD}$ node. This prevents the supply voltage in the adjacent column 90 from collapsing, enabling a memory cell 92 in the same row 94 within the adjacent column to retain its data. Thus the lateral spread of soft errors along a row parallel to the word-lines within the memory array 84 is limited if not substantially eliminated.

Figure 8B:
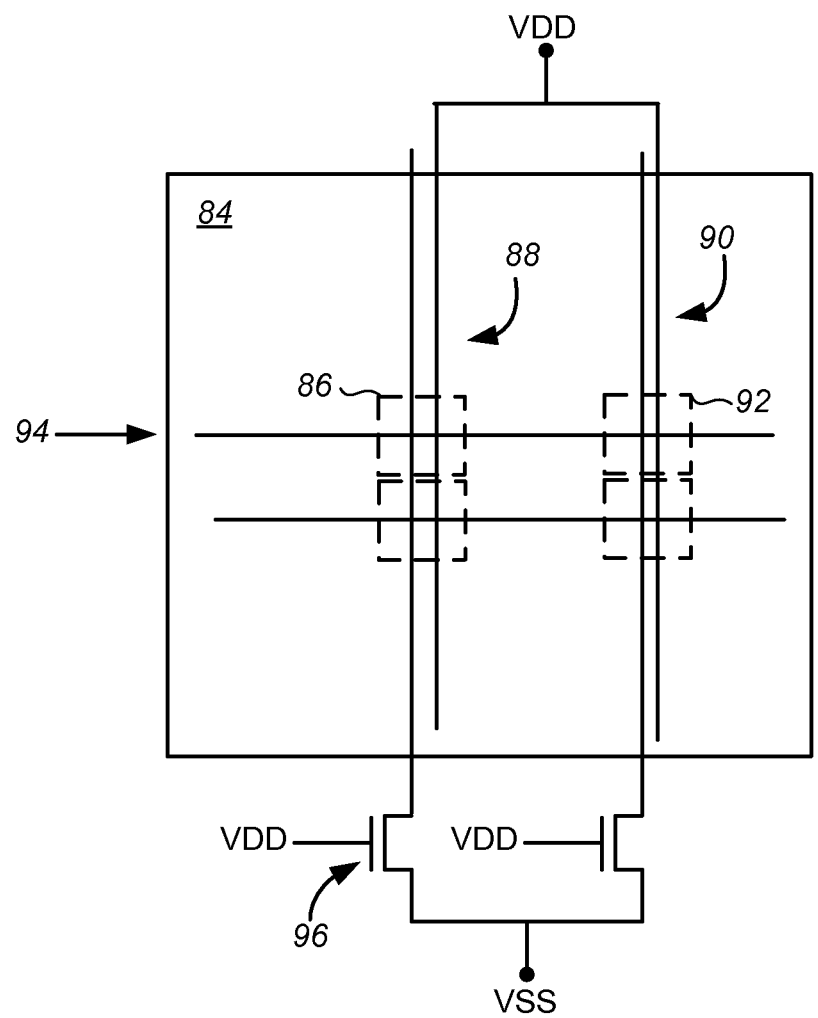

In an alternative embodiment, shown in FIG. 8B, a NMOS current limiting device 96, such as a n-type field-effect-transistor (NFET), can be placed in $V_{SS}$ path of each column within the memory array 84 with a gate of the current limiting device coupled to $V_{DD}$.

It has been found that the lateral spread of soft errors along a row resulting from a single high energy particle interacting with a 90 nanometer (nm) SRAM device with a PMOS current limiting device is less than 10 columns wide versus a spread of more than 57 columns in an identical SRAM device without the current limiting device of the present disclosure.

Figure 9:
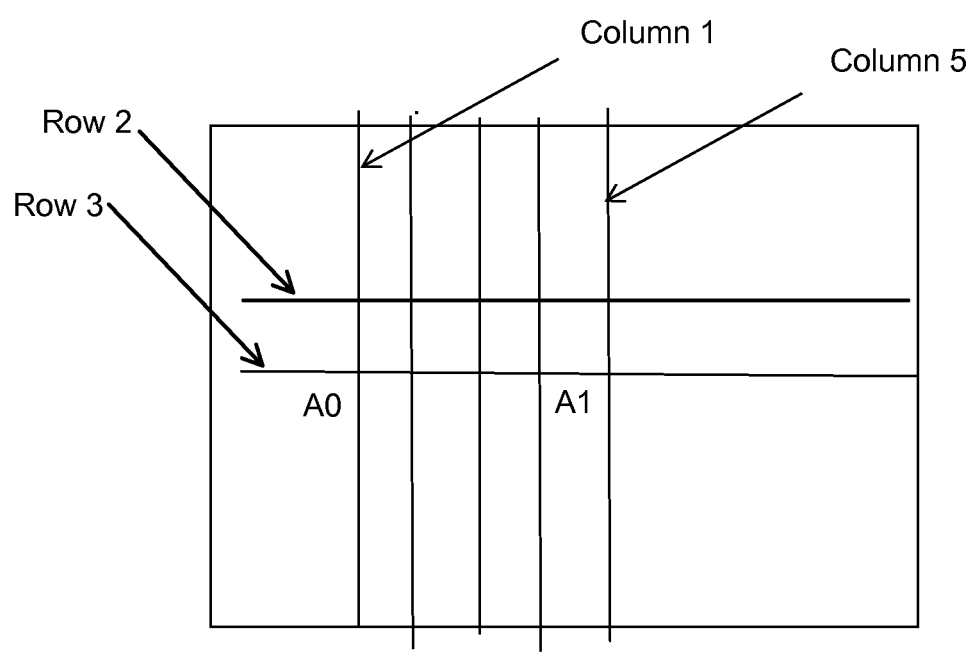
FIG. 9 depicts a compact 4-bit interleaving scheme for use with a memory having one or more current-limiting devices.

In another embodiment, the memory device may further include or implement an interleaving scheme chosen to prevent appearance of physically adjacent multiple bit failures along a row (i.e. parallel to word lines) in a single memory word. It will be understood however that because current limiting device of the present disclosure limits that the lateral spread of soft errors along a row, the interleaving scheme chosen can be a more compact interleaving scheme having a width substantially less than that used in prior art memory devices. FIG. 9, illustrates a 4-bit interleaving scheme is for use with a memory having one or more current-limiting devices as described above. It will be understood that the 4-bit interleaving scheme is more compact than a 16 or 32-bit interleaving scheme, used in prior technologies. This means fewer bitlines need to be charged up or discharged for each memory operation, thus leading to a power saving. It will further be understood, such a compact 4-bit interleaving scheme would not suitable for preventing lateral spread of soft errors in memories not including current-limiting devices as described above. Referring to FIG. 9, it is noted that bit 0 of word A stored in row 3 is stored in col 1 while bit 1 of word A is stored in col 5, leading to a 4 bit interleaving scheme.

In yet another embodiment, the memory device may further include or implement an error correction code (ECC) scheme to detect and correct bit errors within a word. Again, it will be understood that because current limiting device of the present disclosure limits that the lateral spread of soft errors along a row, the complexity and number of ECC bits used per word can be substantially less than that used in prior art memory devices, thus lowering ECC overhead. For example, the ECC scheme may be a simplified ECC to correct only 1 bit in a word leading to fewer correction bits and hence a more compact memory array. Use of a single error correct (SEC) scheme rather than dual error correct (DEC) scheme, such as used in the prior technology, results in an ECC overhead of just 6 bits for a 32 bit word as opposed to 12 bits for the DEC scheme.

Embodiments of methods for substantially preventing or limiting the lateral spread of soft errors along a row resulting from a single soft error will now be described with reference to the flow chart of FIG. 10.

Figure 10:
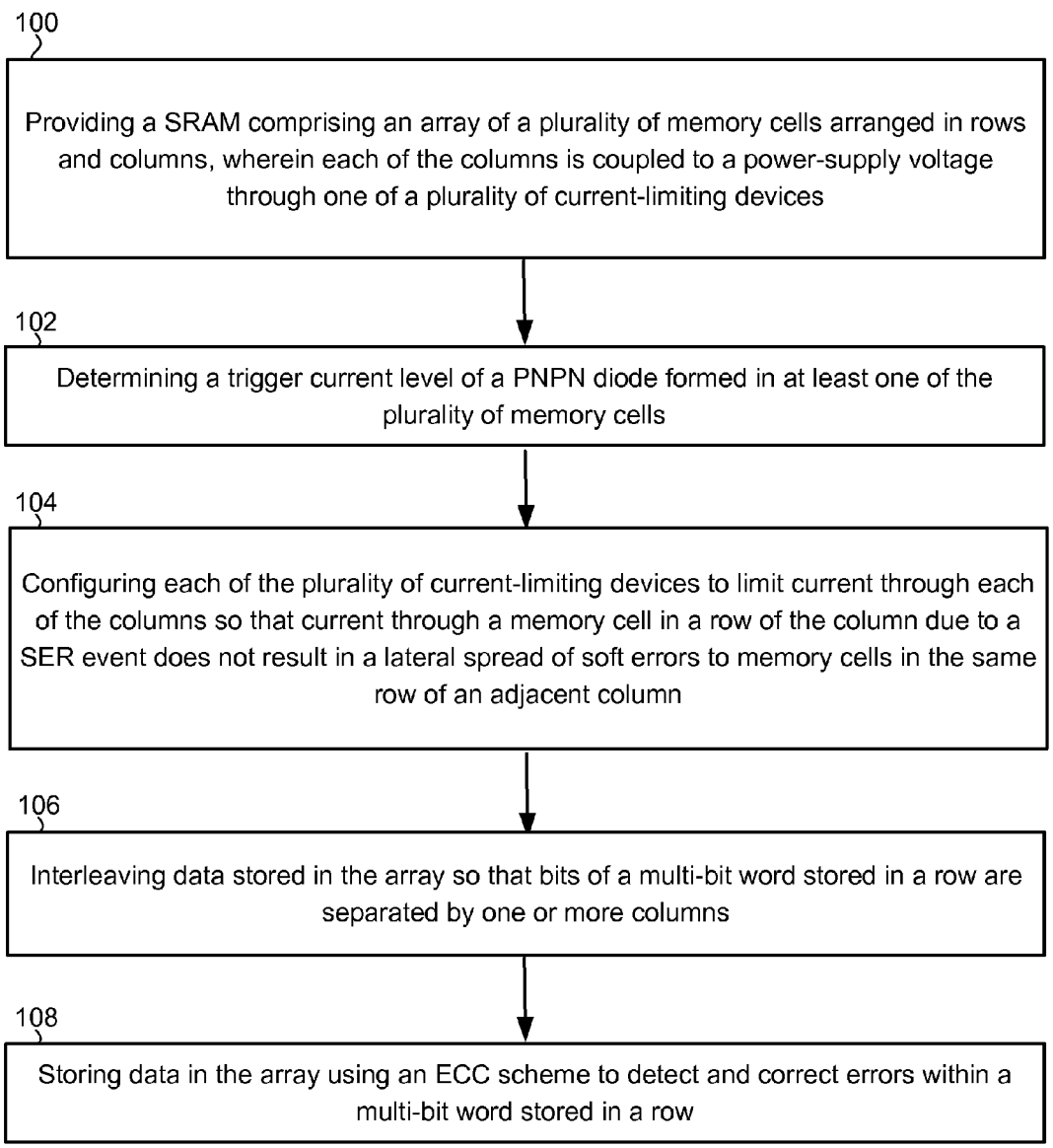
FIG. 10 depicts a flow chart of a method for preventing the spread of soft errors along rows in the array.

Referring to FIG. 10, in a first block or step, the method begins with providing a memory, such as a static random access memory (SRAM), including an array of a plurality of memory cells arranged in rows and columns, wherein each of the columns is coupled to a power-supply voltage through one of a plurality of current-limiting devices (block 100). As noted above the current-limiting devices can include PFETs through which the columns are coupled to $V_{DD}$, each PFET having a gate coupled to $V_{SS}$, or NFETs through which the columns are coupled to $V_{SS}$, each NFET having a gate coupled to $V_{DD}$.

Next, a trigger current level of a pnpn diode formed in at least one of the plurality of memory cells is determined (block 102). As noted above, this can include selecting a current-limiting device having a current-voltage characteristic which intersects a current-voltage plot of the pnpn diode at a level below the trigger current level.

Each of the current-limiting devices is then configured to limit current through each of the columns so that current through a memory cell in a row of the column due to a SER event does not result in a lateral spread of soft errors to memory cells in the same row of an adjacent column (block 104). Again, as noted above this can include configuring each of the current-limiting devices so that current through the memory cell in the row of the column does not exceed a trigger current level of a pnpn diode formed in the memory cell. This can be accomplished by selecting a current-limiting device having a current-voltage characteristic which intersects a current-voltage plot of the pnpn diode at a level below the trigger current level.

Optionally, the method can further include interleaving data stored in the array so that bits of a multi-bit word stored in a row are separated by one or more columns (block 106), and/or storing data in the array using an ECC scheme to detect and correct errors within a multi-bit word stored in a row (Block 108). The interleaving may include a compact interleaving scheme, such as that described above, in which that bits of a multi-bit word stored in a row are separated by less than about 4 columns. The ECC scheme may include a single error correct (SEC) scheme to detect and correct single bit errors within a multi-bit word stored in a row.

It will be appreciated to those skilled in the art having the benefit of this disclosure that this invention is believed to provide CMOS circuit which is configured to prevent latch up without increasing memory cell size. Further modifications and alternative embodiments of various aspects of the invention will be apparent to those skilled in the art in view of this description. For example, the circuit and method described herein may be incorporated into any memory device comprising CMOS transistors. In addition, the circuits described herein may include any other methods for reducing and/or eliminating latch-up with memory cells. In particular, the circuits described herein may additionally include well regions and/or substrate and well contacts to prevent the phenomenon of latch up within memory cells. It is intended that the following claims be interpreted to embrace all such modifications and changes and, accordingly, the specification and drawings are to be regarded in an illustrative rather than a restrictive sense.

What is claimed is:

1. A method, comprising:
providing a memory comprising an array of a plurality of memory cells arranged in rows and columns;
creating a current-voltage plot of a pnpn diode formed in at least one of the plurality of memory cells;
selecting a plurality of current-limiting devices each having a current-voltage characteristic that intersects the current-voltage plot at a level below a trigger current level of the pnpn diode; and
coupling each of the columns to a supply voltage through one of the plurality of current-limiting devices to limit current through each of the columns so that current through a memory cell in a row of the column due to a soft error does not result in a lateral spread of soft errors to a memory cell in the row in an adjacent column.

2. The method of claim 1, further comprising interleaving data stored in the array so that bits of a multi-bit word stored in a row are separated by one or more columns.

3. The method of claim 1, further comprising storing data in the array using a single error correct (SEC) scheme to detect and correct single bit errors within a multi-bit word stored in a row.

4. The method of claim 1, wherein supply voltage comprises a positive supply voltage (VDD), and each of the plurality of current-limiting devices comprise a p-type field-effect-transistor (PFET) having a gate coupled to a negative supply voltage (VSS).

5. The method of claim 1, wherein supply voltage comprises a negative supply voltage (VSS), and each of the plurality of current-limiting devices comprise a n-type field-effect-transistor (NFET) having a gate coupled to a positive supply voltage (VDD).

6. The method of claim 1, wherein the memory comprises a static random access memory (SRAM).

7. A circuit comprising:
a static random access memory (SRAM) comprising an array of a plurality of memory cells arranged in rows and columns; and
a plurality of current-limiting devices, wherein each of the columns is coupled to a supply voltage through one of the plurality of current-limiting devices,
wherein at least one of a plurality of memory cells comprises a pnpn diode, and wherein each of the plurality of current-limiting devices is configured to have a current-voltage characteristic that intersects a current-voltage plot of the pnpn diode at a current less than a trigger current of the pnpn diode, thereby limiting current through each of the columns so that current through a memory cell in a row of the column due to a soft error does not result in a lateral spread of soft errors to memory cells in the row in an adjacent column.

8. The circuit of claim 7, wherein supply voltage comprises a positive supply voltage (VDD), and the current-limiting device comprises a p-type field-effect-transistor (PFET) having a gate coupled to a negative supply voltage (VSS).

9. The circuit of claim 8, wherein the PFET is selected to a have a current-voltage characteristic which intersects a current-voltage plot of the pnpn diode at a level below the trigger current level.

10. The circuit of claim 7, wherein supply voltage comprises a negative supply voltage (VSS), and the current-limiting device comprises a n-type field-effect-transistor (NFET) having a gate coupled to a positive supply voltage (VDD).

11. The circuit of claim 9, wherein the NFET is selected to a have a current-voltage characteristic which intersects a current-voltage plot of the pnpn diode at a level below the trigger current level.

12. A method, comprising:
creating a current-voltage plot of a pnpn diode formed in at least one of a plurality of memory cells in an array of memory cells arranged in rows and columns;
selecting a plurality of current-limiting devices each having a current-voltage characteristic that intersects the current-voltage plot at a current less than a trigger current of the pnpn diode;
providing a memory comprising an array of the plurality of memory cells arranged in rows and columns, wherein each of the columns is coupled to a supply voltage through at least one of the plurality of current-limiting devices so that current through a memory cell in a row of the column due to a soft error does not result in a lateral spread of soft errors to a memory cell in the row in an adjacent column.

13. The method of claim 12, further comprising interleaving data stored in the array so that bits of a multi-bit word stored in a row are separated by one or more columns.

14. The method of claim 12, further comprising storing data in the array using a single error correct (SEC) scheme to detect and correct single bit errors within a multi-bit word stored in a row.

15. The method of claim 12, wherein supply voltage comprises a positive supply voltage (VDD), and each of the plurality of current-limiting devices comprise a p-type field-effect-transistor (PFET) having a gate coupled to a negative supply voltage (VSS).

16. The method of claim 12, wherein supply voltage comprises a negative supply voltage (VSS), and each of the plurality of current-limiting devices comprise a n-type field-effect-transistor (NFET) having a gate coupled to a positive supply voltage (VDD).

17. The method of claim 12, wherein the memory comprises a static random access memory (SRAM).

* * * * *